United States Patent
Jeong

(10) Patent No.: US 10,414,286 B1
(45) Date of Patent: Sep. 17, 2019

(54) HYBRID POWER CONTROL UNIT FOR VEHICLE

(71) Applicants: HYUNDAI MOTOR COMPANY, Seoul (KR); KIA MOTORS CORPORATION, Seoul (KR)

(72) Inventor: Sang Chan Jeong, Seoul (KR)

(73) Assignees: HYUNDAI MOTOR COMPANY, Seoul (KR); KIA MOTORS CORPORATION, Seoul (KR)

( * ) Notice: Subject to any disclaimer, the term of this patent is extended or adjusted under 35 U.S.C. 154(b) by 0 days.

(21) Appl. No.: 16/053,032

(22) Filed: Aug. 2, 2018

(30) Foreign Application Priority Data

Mar. 7, 2018 (KR) .................. 10-2018-0026657

(51) Int. Cl.
*H05K 7/20* (2006.01)
*B60L 11/18* (2006.01)

(52) U.S. Cl.
CPC ....... *B60L 11/1877* (2013.01); *B60L 11/1874* (2013.01); *H05K 7/2089* (2013.01); *H05K 7/20845* (2013.01); *B60L 2210/10* (2013.01)

(58) Field of Classification Search
CPC ......... H01L 2924/00; H01L 2924/0002; H01L 23/473; H01L 2924/13055; H01L 25/072; H01L 2924/1305; H01L 23/3672; H01L 23/4012; H01L 25/117; H01L 23/367; H05K 7/20927; H05K 7/20254; H05K 1/0203; H05K 7/1432; H05K 7/209; H05K 7/2089; H05K 7/20872; H05K 7/20845; H02M 7/003; B60L 50/51; B60L 2240/545; B60L 1/003; B60L 2240/36; B60L 2240/525; B60L 15/007; B60L 58/26; B60L 2240/425; B60L 2240/445; B60L 3/00; B60L 2210/30; B60L 2210/40; B60L 11/1877; B60L 2210/10; H01H 9/52; H02K 11/33; H02K 9/22; H02K 9/00; B60K 11/02; F01P 2050/24; F01P 3/12; F28D 9/0043; F28F 9/0246

USPC ....... 361/699, 689, 688, 702, 704; 165/80.4; 318/400.26

See application file for complete search history.

(56) References Cited

U.S. PATENT DOCUMENTS 7,692,923 B2 * 4/2010 Nakamura ......... H05K 7/20927
165/104.33
2015/0328993 A1 * 11/2015 Shin ........................ B60L 11/18
307/10.1

FOREIGN PATENT DOCUMENTS

KR 10-0998810 B1 12/2010

* cited by examiner

*Primary Examiner* — Mandeep S Buttar
(74) *Attorney, Agent, or Firm* — Morgan, Lewis & Bockius LLP

(57) ABSTRACT

A hybrid power control unit for a vehicle according to the present disclosure includes: a capacitor module; first and second coolers disposed on opposite sides of the capacitor module, the coolers including flow paths extending along lengthwise directions of the capacitor module; a plurality of power modules each being installed between the branch flow paths of one of the first and the second coolers; a low DC-DC converter (LDC) module disposed on one of the first and second coolers to be in contact with a remaining one of the branch flow paths of the cooler having the LDC module; a gate board having a top surface being electrically connected to the power modules; and a control board having a top surface being electrically connected to the gate board and the LDC module.

11 Claims, 5 Drawing Sheets

[FIG. 1]
--PRIOR ART--
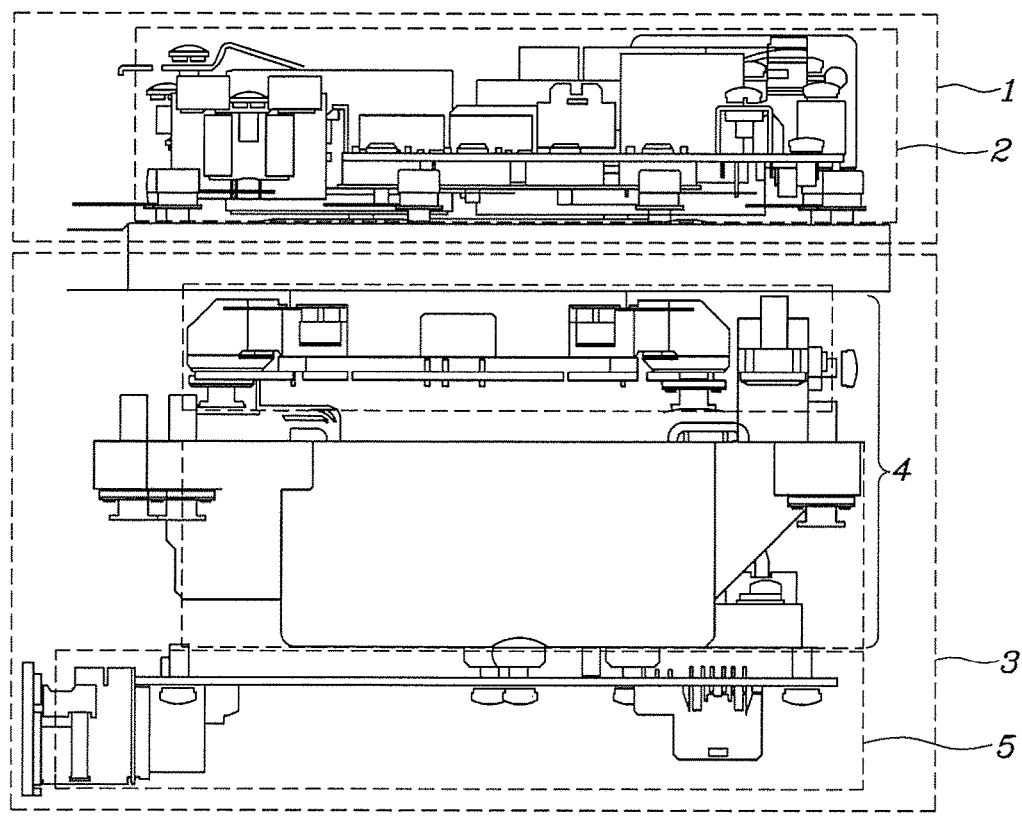

[FIG. 2]
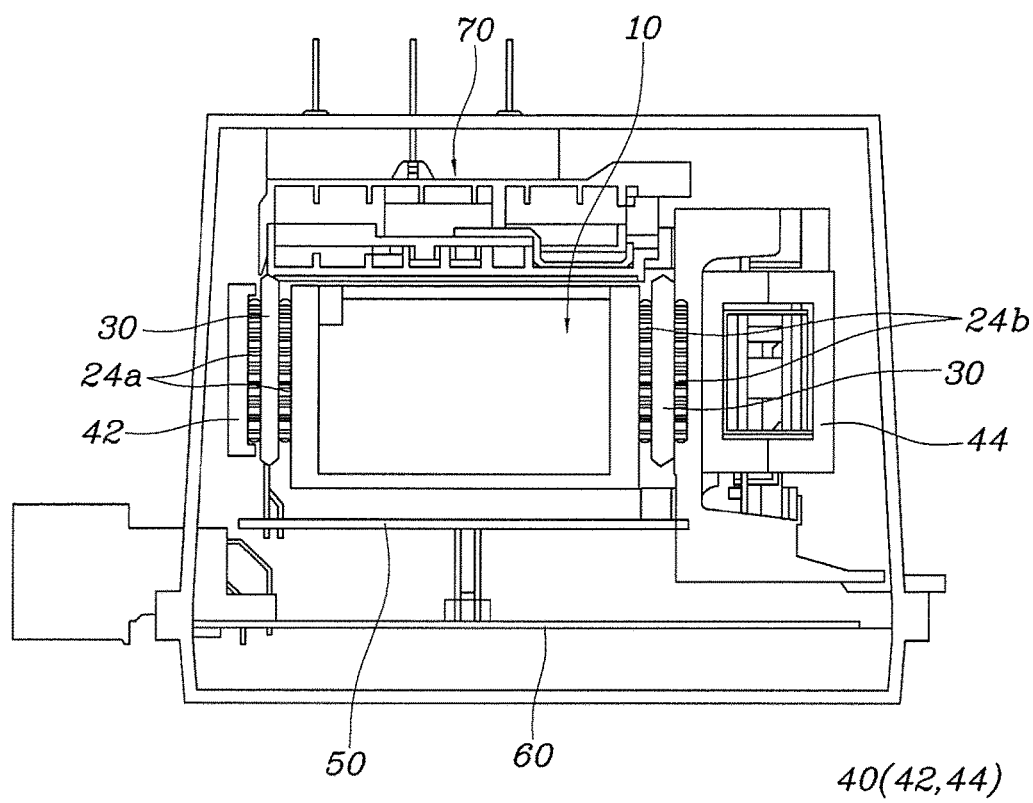

[FIG. 3]
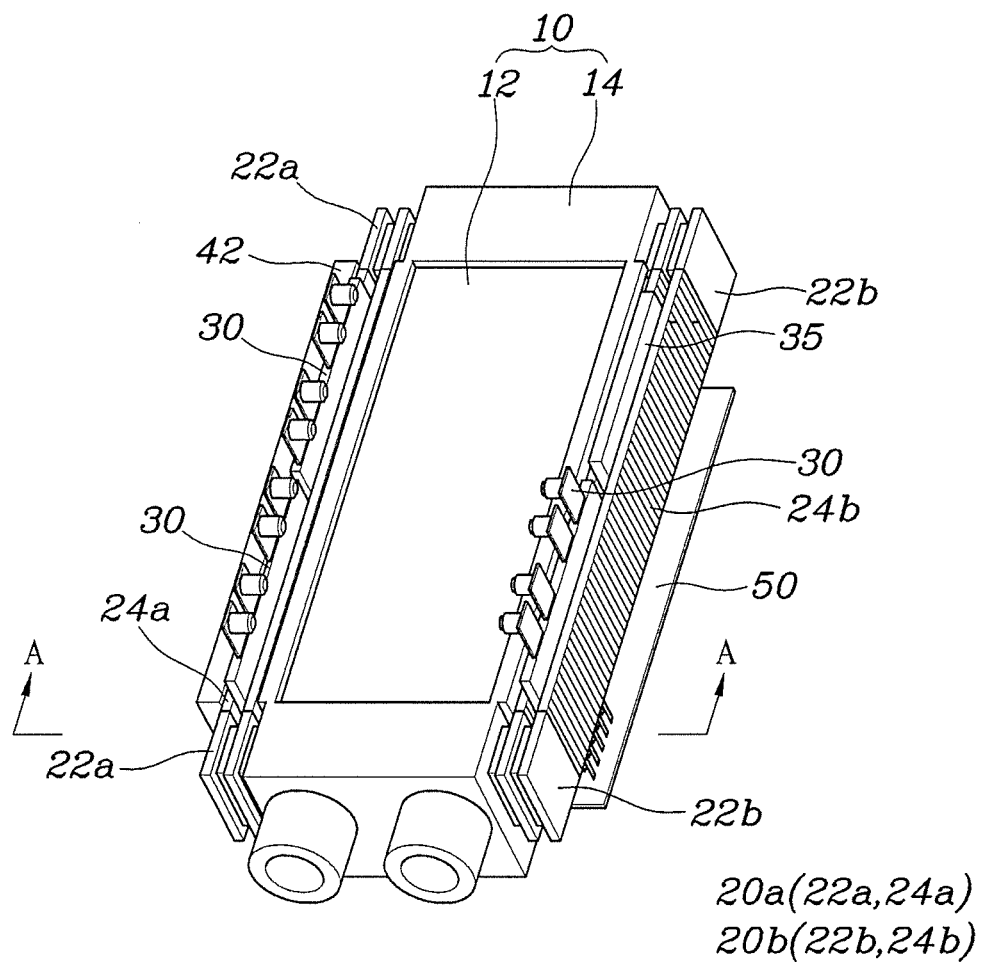

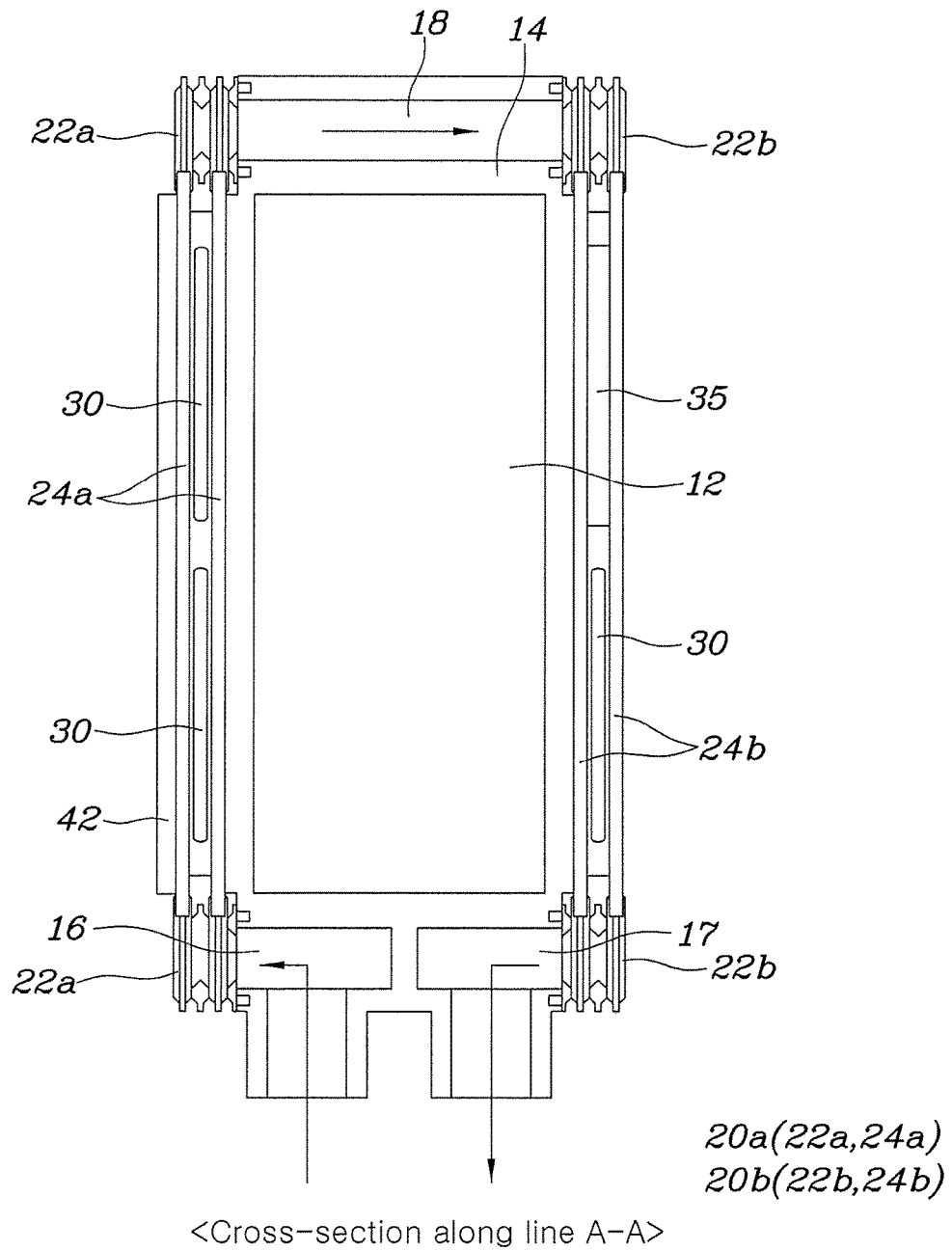
[FIG. 4]
<Cross-section along line A-A>

[FIG. 5]
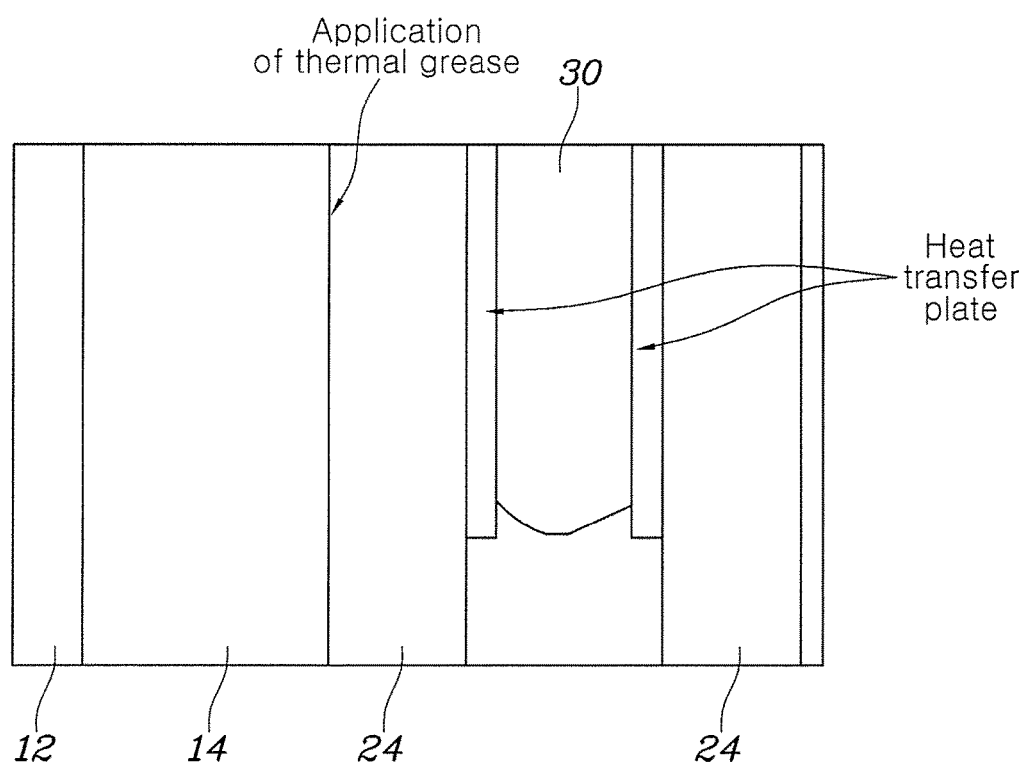

HYBRID POWER CONTROL UNIT FOR VEHICLE

CROSS REFERENCE TO RELATED APPLICATION

The present application is based on and claims the benefit of priority to Korean Patent Application No. 10-2018-0026657, filed Mar. 7, 2018, the entire contents of which is incorporated herein for all purposes by this reference.

TECHNICAL FIELD

The present disclosure relates generally to a hybrid power control unit for a vehicle capable of enhancing capacitor performance by maximizing cooling efficiency of a capacitor and improving assemblability of the hybrid power control unit by simplifying the internal structure thereof.

BACKGROUND

Generally, a green vehicle such as a hybrid vehicle, an electric vehicle, etc., uses an electric motor as a driving source and a high voltage battery as an energy source to drive the electric motor. The green vehicle uses an inverter providing power to the electric motor and a low DC-DC converter (LDC) to generate 12V power supply for a vehicle as power conversion parts.

Converting a DC power supply of the high voltage battery into a three-phase AC power supply, the inverter disposed between the electric motor and the high voltage battery provides the three-phase AC power supply to the electric motor. Also, the LDC supplies the 12V DC power supply to an automotive application component by converting the DC power supply of the high voltage battery into a DC power supply of 12V for a vehicle.

Recently, a unit that integrates an inverter, a converter and a control board for a control thereof in a package shape has been named a Hybrid Power Control Unit (HPCU).

In addition, the HPCU for the green vehicle is required to achieve miniaturization, simplification, and high efficiency through enhancement of cooling efficiency and improvement of packaging structure.

FIG. 1 is a view schematically illustrating a power control unit for a conventional green car.

As illustrated in FIG. 1, a power control unit for a conventional green vehicle is configured with a converter 2 installed in a first housing 1 and an inverter 4 and a control board 5 installed in a second housing 3, wherein the first housing 1 and the second housing 3 are arranged neighboring each other.

In the inverter 4, a plurality of power modules such as Insulated Gate Bipolar Transistors (IGBT) are provided, and a gate board and a capacitor module are composed for a control of the power modules.

This type of power control unit for the conventional green vehicle has the following drawbacks.

Since the housings for the inverter and converter are separately provided, so it is difficult for size thereof to be reduced.

Also, since the gate board and control board are arranged to have the capacitor therebetween and are connected through wiring, a separate space for wiring is required.

The power module adopts a structure having only one surface thereof cooled, so cooling efficiency thereof is low.

Since the capacitor has no cooling structure, there is a limitation in size reduction and cooling of the capacitor.

Since mounted component parts such as the converter, inverter, and control board are each installed by being individually clamped in first and second sealed housings, assemblability thereof complex.

The foregoing is intended merely to aid in the understanding of the background of the present disclosure, and is not intended to mean that the present disclosure falls within the purview of the related art that is already known to those skilled in the art.

SUMMARY

Accordingly, the present disclosure has been made keeping in mind the above problems occurring in the related art, and the present disclosure is intended to propose a hybrid power control unit for a vehicle improving cooling efficiency by applying an efficient cooling structure and facilitating reduction of package volume by optimizing configuration of an inverter, a capacitor, and a control board in a sealed space.

In order to achieve the above object, according to one aspect of the present disclosure, a hybrid power control unit for a vehicle may include: a capacitor module; first and second coolers disposed on opposite sides of the capacitor module, the first and second coolers including flow paths extending along lengthwise directions of the capacitor module, each end of the first and second coolers being configured as a single flow path, and each intermediate portion of the coolers being configured as a plurality of branch flow paths branched off from the corresponding single flow path and arranged along an axial direction of the capacitor module, one of the branch flow paths of each cooler being in contact with the capacitor module; a plurality of power modules each being disposed between the branch flow paths of one of the first and the second coolers, opposite sides of the plurality of power modules being in contact with the corresponding branch flow paths to allow heat transfer to take place therethrough; and a low DC-DC converter (LDC) module disposed on one of the first and second coolers to be in contact with a remaining one of the branch flow paths of the one of the first and second coolers having the LDC module.

The hybrid power control unit may further include a gate board disposed below the capacitor module and the first and second coolers, a top surface of the gate board being electrically connected to the plurality of power modules placed thereabove; and a control board disposed below the gate board and the LDC module, a top surface of the control board being electrically connected to the gate board and the LDC module.

The capacitor module may be configured to include: a capacitor; and a capacitor housing surrounding the capacitor and having an inflow path that cooling water enters, an outflow path that cooling water is discharged from, and a linking flow path extending along a lateral direction between the first and second cooler, wherein the inflow and outflow paths are provided at the inside of a front side of the capacitor module, and the linking flow path is provided at the inside of a rear side of the capacitor module, and the first cooler links the inflow path to one end of the linking flow path, and the second cooler links an opposite end of the linking flow path to the outflow path.

The capacitor housing may be made of a metal material.

The power module may be mounted on a top surface of the gate board with interposition of a board-to-board (BTB) connector, the gate board is electrically connected to a top surface of the control board by being mounted thereon with interposition of a BTB connector, and the LDC module is electrically connected to the control board with interposition of a BTB connector or a wire.

A thermal grease may be applied or a heat transfer plate may be provided to at least one of space between the capacitor module and each of the first and second coolers, a space between the branch flow paths of each of the first and second coolers and the plurality of power modules, and a space between one of the first and second coolers and the LDC module.

The hybrid power control unit may further include a dummy of metal or plastic material filling a space excluding the plurality of power modules between the branch flow paths of each of the first and second coolers by being disposed therebetween.

The LDC module may be configured to include: an assembly plate provided such that one side thereof is in contact with the remaining one of the branch flow paths of the cooler having the LDC module; and an LDC being disposed on an opposite side of the assembly plate and outputting power by converting high voltage input into low voltage.

The first or second cooler having no LDC module is provided with only an assembly plate on a remaining one of the branch flow paths thereof.

The hybrid power control unit may further include a three-phase output power module disposed above the capacitor module and configured to output three-phase AC power to an upward direction by being connected with the capacitor module and the plurality of power modules.

The hybrid power control unit may be disposed in a single enclosure which is a multi-piece assembly.

According to the hybrid power control unit for the vehicle configured in a structure as described above, the hybrid power control unit is configured in a simple structure while maximizing the cooling efficiency of the capacitor.

Accordingly, the hybrid power control unit can allow the capacitor to secure durability and reduction of the package volume, thereby ultimately enhancing merchantability thereof.

In addition, unlike the conventional gate board that was configured as a plurality of members, the gate board of the present disclosure is configured as a single member, thus the package volume of the hybrid power control unit can be effectively reduced.

Furthermore, the gate board and the control board (or controller) are designed to be connected to other elements using a BTB connector without using separate wiring, thus assemblability and manufacturability of the hybrid power control unit can be enhanced.

BRIEF DESCRIPTION OF THE DRAWINGS

The above and other objects, features and other advantages of the present disclosure will be more clearly understood from the following detailed description when taken in conjunction with the accompanying drawings, in which:

FIG. 1 is a drawing schematically illustrating a power control unit for a conventional green car;

FIG. 2 is a cross-sectional view illustrating an internal structure of a hybrid power control unit for a vehicle according to an exemplary embodiment of the present disclosure;

FIG. 3 is a perspective view illustrating an assembly of a capacitor module, first and second coolers, power modules, and a gate board according to an exemplary embodiment of the present disclosure;

FIG. 4 is a cross-sectional view illustrating a cross-section taken along line A-A in FIG. 3; and FIG. 5 is a cross-sectional view illustrating in detail an assembled state of a capacitor module, the first and the second coolers and a power module.

DETAILED DESCRIPTION OF THE INVENTION

Hereinbelow, exemplary embodiments of the present disclosure will be described in detail with reference to the accompanying drawings. Throughout the drawings, the same reference numerals will refer to the same or like parts.

FIG. 2 is a cross-sectional view illustrating an internal structure of a hybrid power control unit for a vehicle according to an exemplary embodiment of the present disclosure, FIG. 3 is a perspective view illustrating an assembly of a capacitor module, first and second coolers, power modules, and a gate board according to an exemplary embodiment of the present disclosure, FIG. 4 is a cross-sectional view illustrating a cross-section taken along line A-A in FIG. 3; and FIG. 5 is a cross-sectional view illustrating in detail an assembled state of a capacitor module, the first and the second coolers, and the power module.

Referring to FIGS. 2 to 5, the hybrid power control unit for the vehicle of the present disclosure may include a capacitor module 10 and first and second coolers 20a and 20b disposed on opposite sides of the capacitor module 10. The first and second coolers 20a and 20b may include flow paths extending along lengthwise directions of the capacitor module 10. Each end 22a, 22b of the first and second coolers 20a and 20b may be configured as a single flow path, and each intermediate portion of the coolers 20a and 20b may be configured as a plurality of branch flow paths 24a or 24b branched off from the corresponding single flow path and arranged along the axial direction of the capacitor module 10. One of the branch flow paths 24a or 24b of each cooler may be in contact with the capacitor module 10. The hybrid power control unit may further include a plurality of the power modules 30 each being installed between the branch flow paths 24a or 24b of one of the first and the second coolers 20a and 20b, opposite sides of the power modules 30 being in contact with the corresponding branch flow paths 24a or 24b to allow heat transfer to take place therethrough. The hybrid power control unit may include a low DC-DC converter (LDC) module 40 disposed on one of the first and second coolers 20a and 20b to be in contact with a remaining one of the branch flow paths 24a or 24b of the cooler having the LDC module 40; a gate board 50 disposed below the capacitor module 10 and the first and second coolers 20a and 20b, a top surface of the gate board being electrically connected to the power modules 30; and a control board 60 disposed below the gate board 50 and the LDC module 40, a top surface of the control board 60 being electrically connected to the gate board 50 and the LDC module 40.

The capacitor module 10 plays a role of inducing stable DC power to be supplied to a system. That is, the capacitor module 10 performs smoothing effect restraining a sudden voltage/current change on DC input terminals by absorbing a ripple current having high power generated when inverter is switched.

In addition, the first and second coolers 20a and 20b are provided to cool the power module 30 adjacent thereto by allowing cooling water to circulate through an internal flow path thereof.

In the past, because a cooler was designed mainly to cool a power module, cooling of a capacitor was performed only indirectly, whereby efficient cooling was not accomplished. Accordingly, the capacitor has been conventionally designed in a relatively large size to secure thermal durability, which became a factor increasing the cost of manufacturing of the capacitor, thus affecting merchantability.

However, the capacitor module 10 of the present disclosure is directly cooled by the first and second coolers 20a and 20b each being installed on each of opposite sides thereof, and cooling performance thereof is improved by cooling which is accomplished through a plurality of the surfaces, whereby a package volume of the capacitor module 10 is able to be reduced while durability of the capacitor 12 is sufficiently secured.

Here, the first and second coolers 20a and 20b are provided in a shape of flow paths extending along a lengthwise direction to allow cooling water to flow therein, in which the intermediate portions thereof are configured as the plurality of the branch flow paths 24a and 24b branched off to be arranged along the axial direction of the capacitor module 10, and opposite end portions thereof are configured as single flow paths 22a and 22b to feed cooling water to the branch flow paths 24a and 24b, respectively.

Being installed between the branch flow paths 24a or 24b of one of the first and the second coolers 20a and 20b, each of the power modules 30 is cooled by heat exchange through the opposite sides thereof being in contact with the branch flow paths 24a or 24b. Here, since the power modules 30 play a role of converting DC current transferred through the capacitor module 10 into three-phase AC current, cooling efficiency of the power modules 30 is maximized because the power modules 30 are cooled through the opposite sides thereof by the plurality of the branch flow paths 24a or 24b.

Furthermore, since the first and second coolers 20a and 20b are provided such that one side of one of each of the branch flow paths 24a and 24b, most adjacent to the capacitor module 10, is installed to be in contact with the capacitor module 10, the capacitor module 10 is cooled by exchanging heat with the first and second coolers 20a and 20b.

Accordingly, since cooling of the capacitor module 10 and the power module 30 being efficiently performed by the first and second coolers 20a and 20b, size reduction of the capacitor module 10 and damage prevention of the power module 30 may be effectively achieved.

Meanwhile, in the present disclosure, the LDC module 40 is installed in one of the first cooler 20a and the second cooler 20b, wherein the LDC module 40 is to be in contact with one of the branch flow paths 24a or 24b that is not adjacent to the capacitor module 10. The LDC module 40 plays a role to convert a high voltage current transferred to the hybrid power control unit into a low voltage current and transfers the low voltage current to a low voltage battery.

As described, the capacitor module 10, the first and second coolers 20a and 20b, the power modules 30, and the LDC module 40 of the present disclosure are provided to be located at places different from each other in a horizontal position.

Furthermore, the gate board 50, which is disposed below the capacitor module 10 and the first and second coolers 20a and 20b, is arranged to allow the power modules 30 to be physically as well as electrically connected thereto. Similarly, the control board 60, which is disposed below the gate board 50 and the LDC module 40, is arranged to allow the gate board 50 and the LDC module 40 to be physically as well as electrically connected to a top surface thereof.

Accordingly, as illustrated in FIG. 2, provided in a housing of the hybrid power control unit for the vehicle are the capacitor module 10, the first and second coolers 20a and 20b, the power module 30, and the LDC module 40 to compose a central part, and the gate board 50 and the control board 60 to compose a lower part.

In a conventional power conversion module for a vehicle, gate boards were applied by being separated into the same number of power modules. On the other hand, the gate board being composed of a single piece and provided to receive all electrical signals of the plurality of the power modules 30, the present disclosure may effectively reduce package volume.

Accordingly, by efficiently arranging internal structure of the housing of the hybrid power control unit, package volume may be prevented from being increased and cooling performance of the power module and the capacitor may be maximized. Specific reasons why the package volume does not increase will be described later.

Specifically, the capacitor module 10 is configured to include a capacitor 12; and a capacitor housing 14 configured to surround the capacitor 12 and have an inflow path 16 that cooling water enters into, an outflow path 17 that cooling water is discharged from, and a linking flow path 18 extending along a lateral direction between the first and second cooler, wherein the inflow and outflow paths are provided at the inside of a front side, and the linking flow path is provided at the inside of a rear side.

Here, the first cooler 20a links the inflow path 16 to one end of the linking flow path 18, and the second cooler 20b links an opposite end of the linking flow path 18 to the outflow path.

That is, cooling water flows passing through the inflow path 16, the first cooler 20a, the linking flow path 18, the second cooler 20b, and the outflow path 17. Accordingly, cooling water is provided to flow the capacitor housing 14 surrounding the capacitor 12 and the first and second coolers 20a and 20b, whereby cooling is accomplished on all of four side surfaces of the capacitor 12.

As such, as cooling of the capacitor 12 is efficiently accomplished, size reduction may be maximized.

Referring to FIG. 4, the inlet and the outlet which cooling water flows into and is discharged from, respectively, are formed on a front side surface of the capacitor housing 14, and the inlet and the outlet communicate with the inflow path 16 and the outflow path 17, respectively. The inflow path 16 and the outflow path 17 are each formed to be bent at an intermediate location and to extend to one of the side directions, thereby communicating with one of the corresponding first and second coolers 20a and 20b installed on the opposite sides of the capacitor module 10.

Here, the capacitor housing 14 may be composed of metal material. Since the capacitor housing 14 of the metal material facilitates heat transfer to be easily accomplished, cooling of the capacitor 12 is effectively accomplished, thereby contributing to minimizing the size of the capacitor 12.

Referring to FIG. 4, the single flow paths 22a and 22b, which are opposite ends of each of the first and second coolers 20a and 20b, respectively, are configured in a shape extending to one of side directions from the inflow path 16, the outflow path 17, or the linking flow path 18 of the capacitor housing 14. In addition, each of the plural number of the branch flow paths 24a and 24b is configured to have plural number of flow paths extending to a direction vertical to one of the single flow paths 22a or 22b extending to one of the side directions.

Meanwhile, the power module 30 is mounted on a top surface of the gate board 50 with interposition of a board-to-board (BTB) connector, the gate board 50 is electrically connected to a top surface of the control board 60 by being mounted thereon with interposition of a BTB connector, and the LDC module 40 may be electrically connected to the control board 60 with interposition of a BTB connector or a wire.

That is, being electrically connected to the power modules 30, the gate board 50 controls AC output power through the power modules 30 by transmitting a control signal, or checks the power modules 30 in terms of a current, voltage, and an occurrence or nonoccurrence of a fault.

Here, when the power module 30 is electrically connected to the gate board 50, since the power module 30 is disposed above the gate board 50 as illustrated in FIG. 2, the power module 30 may be easily mounted on a top surface of the gate board 50 with interposition of a BTB connector without executing separate wiring connection work. Accordingly, manufacturing cost and time required for the hybrid power control unit may be effectively reduced by improving manufacturability of the hybrid power control unit for a vehicle.

In addition, being electrically connected to the control board 60, the gate board 50 is provided to receive a control signal, and being electrically connected to the control board 60, the LCD module 40 is also provided to be controlled for the operation converting a high voltage current into a low voltage current. Meanwhile, being disposed above the control board 60, the gate board 50 and the LDC module 40 may be easily connected to the control board 60 by using the BTB connector.

Here, if the LDC module 40 and the control board 60 are structurally difficult to connect by using only the BTB connector, then wiring will be acceptable for connection thereof.

Meanwhile, referring to FIG. 5, thermal grease may be applied or a heat transfer plate may be provided to at least one of spaces among a space between the capacitor module 10 and each of the first and second coolers 20*a* and 20*b*, a space between the branch flow paths 24*a* or 24*b* of each of the first and second coolers 20*a* and 20*b* and the power modules 30, and a space between one of the first and second coolers 20*a* and 20*b* and the LDC module 40.

The thermal grease or the heat transfer plate plays a role in maximizing heat transfer efficiency between two bodies. Accordingly, cooling efficiency of the hybrid power control unit for the vehicle may be improved by applying the thermal grease or by installing the heat transfer plate to contact areas between any two of the capacitor module 10, the first and second coolers 20*a* and 20*b*, the power module 30, and the LDC module 40.

The hybrid power control unit for the vehicle of the present disclosure may further include a dummy 35 of metal or plastic material filling a space excluding the power modules between the branch flow paths 24*a* or 24*b* of each of the first and second coolers 20*a* and 20*b* by being disposed therebetween.

Being installed in a space between each of the branch flow paths 24*a* and 24*b* of the first and second coolers 20*a* and 20*b*, each of the power modules 30 is composed of three modules to output three-phase power. In an installation process of the power modules 30, an empty space is formed between flow paths of each of the plurality of the branch flow paths 24*a* and 24*b*, and the empty space, if left, may become vulnerable part for durability of the cooler.

Accordingly, the merchantability of the first and second coolers 20*a* and 20*b* may be enhanced by installing the dummy 35 of heat conductive or nonconductive material in an empty space between each of the branch flow paths 24*a* and 24*b*.

Meanwhile, the LDC module 40 of the present disclosure may include: an assembly plate 42 provided such that one side thereof is in contact with the remaining one of the branch flow paths 24*a* or 24*b* of the cooler having the LDC module; and an LDC 44 disposed on an opposite side of the assembly plate 42 and outputting power by converting high voltage input into low voltage.

As illustrated in FIGS. 2 to 4, a structure of the hybrid power control unit for the vehicle may be optimized only if the LDC module 40 is provided to be in a horizontal position with the capacitor module 10, the first and second coolers 20*a* and 20*b*, and the power module 30.

Accordingly, the LDC 44 is installed in one of the first and second coolers 20*a* and 20*b* with interposition of the separate assembly plate 42.

Here, the first or second cooler having no LDC module is provided with only an assembly plate is installed at a remaining one of the branch flow paths 24*a* or 24*b* thereof. Accordingly, the cooler may be prevented from being damaged by an external impact.

Referring to FIG. 2 again, the hybrid power control unit for the vehicle of the present disclosure may further include a three-phase output power module 70 disposed above the capacitor module 10 and configured to output three-phase AC power to an upward direction by being connected with the capacitor module 10 and the power modules 30. Also, the hybrid power control unit may be disposed in a single enclosure which is a multi-piece assembly.

That is, a DC current supplied to the hybrid power control unit for the vehicle of the present disclosure is converted into a three-phase AC current by passing through the capacitor 12 and the power module 30. Here, the three-phase AC current is output to a motor or a Hybrid Start Generator (HSG) through the three-phase output power module 70, thus driving a motor device.

Here, with the three-phase output power module 70 provided above the capacitor module 10, lengths of parts required for connecting the three-phase output power module 70 and the capacitor module 10, and the three-phase output power module 70 and the power module 30 may be minimized, and the structure inside the power control unit housing may be optimized.

According to the hybrid power control unit for the vehicle configured in a structure as described, while maximizing the cooling efficiency of the capacitor, the hybrid power control unit is provided to be configured in a simple structure. Accordingly, the hybrid power control unit can allow securing of the durability of the capacitor and reduction of the package volume, thereby, ultimately enhancing merchantability thereof.

In addition, the gate board that was conventionally configured as a plurality of members in the past may be configured in a single member, whereby the package volume may be effectively reduced.

Furthermore, the gate board and the control board (or controller) are designed such that the composition may be connected by using a BTB connector without using separate wiring, whereby assemblability and manufacturability may be enhanced.

Although a preferred embodiment of the present disclosure has been described for illustrative purposes, those skilled in the art will appreciate that various modifications, additions and substitutions are possible, without departing from the scope and spirit of the invention as disclosed in the accompanying claims.

What is claimed is:

1. A hybrid power control unit for a vehicle, the hybrid power control unit comprising:
 a capacitor module;
 first and second coolers disposed on opposite sides of the capacitor module, the first and second coolers including flow paths extending along lengthwise directions of the capacitor module, each end of the first and second coolers being configured as a single flow path, and each intermediate portion of the first and second coolers being configured as a plurality of branch flow paths branched off from the corresponding single flow path and arranged along an axial direction of the capacitor module, one of the branch flow paths of each cooler being in contact with the capacitor module;
 a plurality of power modules each being disposed between the branch flow paths of one of the first and second coolers, opposite sides of the plurality of power modules being in contact with the corresponding branch flow paths to allow heat transfer to take place therethrough; and
 a low DC-DC converter (LDC) module disposed on one of the first and second coolers to be in contact with a remaining one of the branch flow paths of the one of the first and second coolers having the LDC module.

2. The hybrid power control unit of claim 1, further comprising:
 a gate board disposed below the capacitor module and the first and second coolers, a top surface of the gate board being electrically connected to the plurality of power modules placed thereabove; and
 a control board disposed below the gate board and the LDC module, a top surface of the control board being electrically connected to the gate board and the LDC module.

3. The hybrid power control unit of claim 1, wherein the capacitor module is configured to include:
 a capacitor; and
 a capacitor housing surrounding the capacitor and having an inflow path that cooling water enters, an outflow path that cooling water is discharged from, and a linking flow path extending along a lateral direction between the first and second coolers, wherein the inflow and outflow paths are provided at the inside of a front side of the capacitor module, and the linking flow path is provided at the inside of a rear side of the capacitor module, and the first cooler links the inflow path to one end of the linking flow path, and the second cooler links an opposite end of the linking flow path to the outflow path.

4. The hybrid power control unit of claim 3, wherein the capacitor housing is made of a metal material.

5. The hybrid power control unit of claim 2, wherein:
 the power module is mounted on a top surface of the gate board with interposition of a board-to-board (BTB) connector,
 the gate board is electrically connected to a top surface of the control board by being mounted thereon with interposition of a BTB connector, and
 the LDC module is electrically connected to the control board with interposition of a BTB connector or a wire.

6. The hybrid power control unit of claim 1, wherein a thermal grease is applied or a heat transfer plate is provided to at least one of a space between the capacitor module and each of the first and second coolers, a space between the branch flow paths of each of the first and second coolers and the plurality of power modules, and a space between one of the first and second coolers and the LDC module.

7. The hybrid power control unit of claim 1, further comprising a dummy of metal or plastic material filling a space excluding the plurality of power modules between the branch flow paths of each of the first and second coolers by being disposed therebetween.

8. The hybrid power control unit of claim 1, wherein the LDC module is configured to include: an assembly plate provided such that one side thereof is in contact with the remaining one of the branch flow paths of the cooler having the LDC module; and an LDC being disposed on an opposite side of the assembly plate and outputting power by converting high voltage input into low voltage.

9. The hybrid power control unit of claim 8, wherein the first or second cooler having no LDC module is provided with only an assembly plate on a remaining one of the branch flow paths thereof.

10. The hybrid power control unit of claim 1, further comprising a three-phase output power module disposed above the capacitor module and configured to output three-phase AC power to an upward direction by being connected with the capacitor module and the plurality of power modules.

11. The hybrid power control unit of claim 1, wherein the hybrid power control unit is disposed in a single enclosure which is a multi-piece assembly.

* * * * *